(12) United States Patent
Bouche et al.

(10) Patent No.: US 10,242,867 B2
(45) Date of Patent: Mar. 26, 2019

(54) GATE PICKUP METHOD USING METAL SELECTIVITY

(71) Applicant: GLOBALFOUNDRIES INC., Grand Cayman (KY)

(72) Inventors: Guillaume Bouche, Albany, NY (US); Vimal Kamineni, Mechanicville, NY (US)

(73) Assignee: GLOBALFOUNDARIES INC., Grand Cayman (KY)

( * ) Notice: Subject to any disclaimer, the term of this patent is extended or adjusted under 35 U.S.C. 154(b) by 38 days.

(21) Appl. No.: 15/598,393

(22) Filed: May 18, 2017

(65) Prior Publication Data
US 2018/0337037 A1 Nov. 22, 2018

(51) Int. Cl.
| H01L 21/02 | (2006.01) |
| H01L 29/78 | (2006.01) |
| H01L 21/28 | (2006.01) |
| H01L 29/49 | (2006.01) |

(52) U.S. Cl.
CPC .. *H01L 21/02175* (2013.01); *H01L 21/02205* (2013.01); *H01L 21/28026* (2013.01); *H01L 21/28185* (2013.01); *H01L 21/28194* (2013.01); *H01L 29/4966* (2013.01); *H01L 29/785* (2013.01)

(58) Field of Classification Search
CPC .............................................. H01L 21/02175
See application file for complete search history.

(56) References Cited

U.S. PATENT DOCUMENTS

| 9,412,641 | B1* | 8/2016 | Guo ................. H01L 21/02225 |
| 2005/0019993 | A1* | 1/2005 | Lee ................... H01L 29/42384 438/157 |
| 2009/0302372 | A1* | 12/2009 | Chang .............. H01L 29/66545 257/327 |
| 2012/0313170 | A1* | 12/2012 | Chang .............. H01L 29/66545 257/347 |
| 2015/0236123 | A1* | 8/2015 | Chang ................ H01L 29/7848 257/347 |
| 2016/0020150 | A1* | 1/2016 | You .................. H01L 29/66545 438/218 |
| 2016/0071774 | A1 | 3/2016 | Wei et al. |
| 2016/0093726 | A1* | 3/2016 | Ching .................. H01L 29/785 257/192 |
| 2016/0254261 | A1* | 9/2016 | Machkaoutsan ...... H01L 21/321 257/369 |
| 2016/0314963 | A1* | 10/2016 | Choi .................... H01L 21/324 |

OTHER PUBLICATIONS

Grank, Yuri, "Correction for Etch Proximity: New Models and Applications";Optical Microlithography XIV, Proceedings of SPIE, vol. 4346 (2001).
U.S. Appl. No. 15/349,358, filed Nov. 11, 2016.

* cited by examiner

*Primary Examiner* — Eugene Lee
(74) *Attorney, Agent, or Firm* — Scully Scott Murphy and Presser; Frank Digiglio

(57) ABSTRACT

A method of fabricating a FinFET device includes forming contact openings for source/drain contacts prior to performing a replacement metal gate (RMG) module. Etch selective metals are used to form source/drain contacts and gate contacts optionally within active device regions using a block and recess technique.

11 Claims, 8 Drawing Sheets

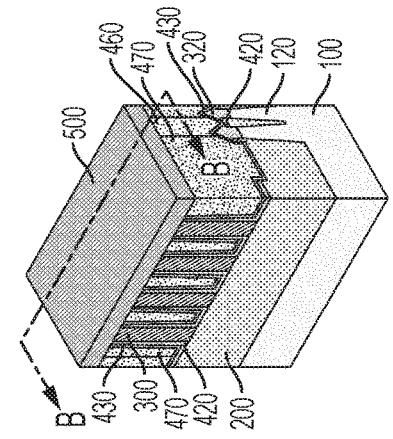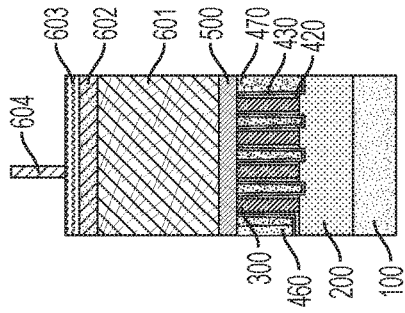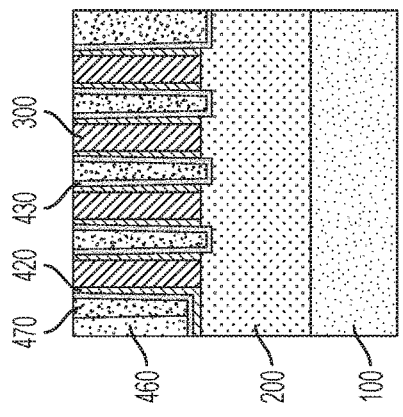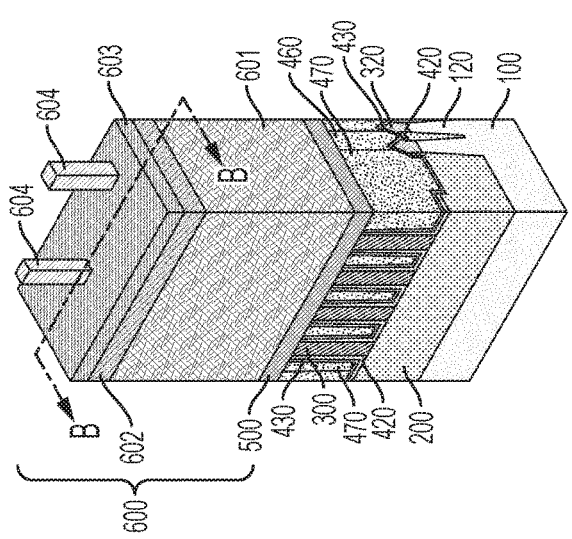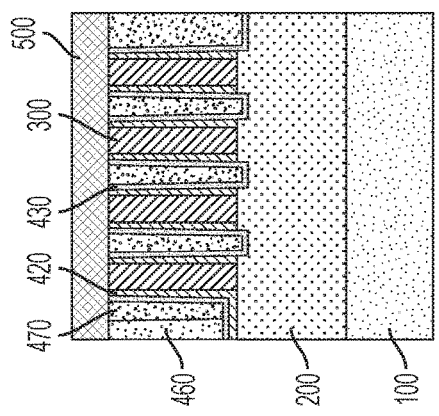

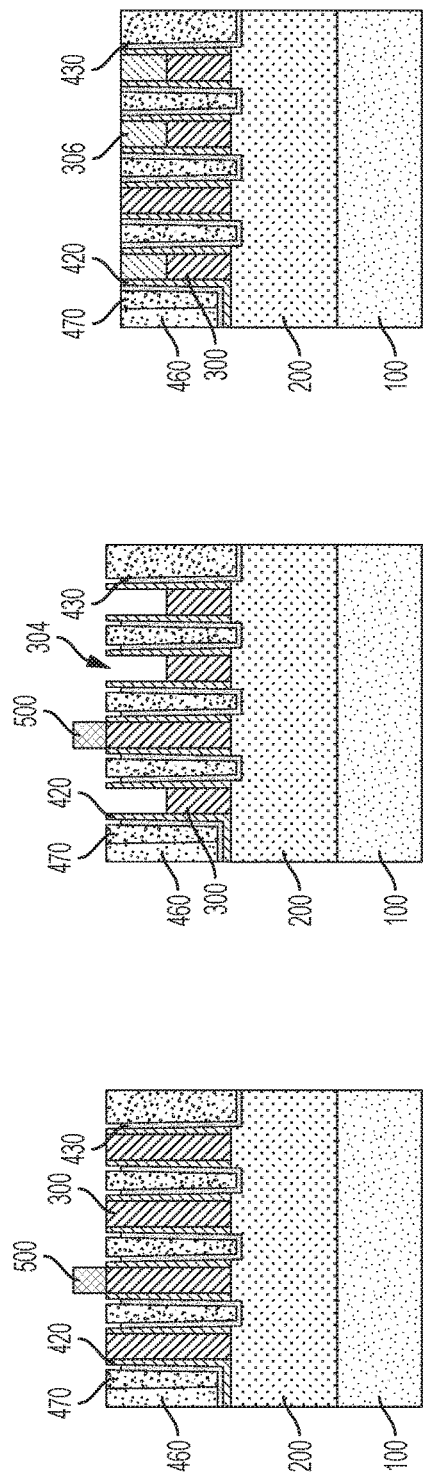

GATE PICKUP METHOD USING METAL SELECTIVITY

BACKGROUND

The present application relates generally to methods for forming semiconductor devices, and more specifically to methods for forming fin field effect transistors (FinFETs) having a reduced risk of electrical shorts between gate and source/drain contacts.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and functionality. However, the decrease in size and the attendant increase in density may also generate undesirable effects, including unwanted interaction between adjacent elements, such as short circuits and the introduction of parasitic capacitance between conductive structures.

In advanced node FinFET devices, for instance, the proximity of gate contacts and source/drain contacts may lead to unwanted conduction, i.e., leakage, between these adjacent structures, particularly at the respective top and bottom portions of the structures. Short circuits can adversely affect performance, reliability and yield.

SUMMARY

It is therefore desirable to develop semiconductor device architectures and methods for fabricating device architectures that have an increased density of elements while exhibiting a decreased propensity for unwanted interactions between adjacent conductive elements, such as the contacts made to the gate and to the source/drain regions of a transistor.

In accordance with various embodiments, a method of forming a FinFET device includes a replacement metal gate (RMG) process flow. In conjunction with the RMG process, gate contacts as well as source/drain contacts are located over active areas of the device. Methods for providing such a structure involve the patterning of trench silicide (TS) contact locations prior to the RMG module. By leveraging the etch selectivity of respective contact metals, conductive structures including gate contacts and source/drain contacts can be placed in close proximity, e.g., within active areas, which beneficially improves device density, without sustaining unwanted interactions between the contacts.

Referring to FIG. 1, a comparative device layout includes a plurality of semiconductor fins 12 arrayed over a semiconductor substrate 10, and a plurality of gates 30 arranged orthogonal to the fins and overlapping channel regions thereof. Raised source/drain junctions 32 are formed over source/drain regions of the fins laterally adjacent to the channel regions. In exemplary embodiments, a first sub-array 13 of fins may be configured to provide an n-MOS circuit, while a second sub-array 14 of fins may be configured to provide a p-MOS circuit.

Source/drain contacts 70 and gate contacts 80 may be formed within vias that extend through an interlayer dielectric (not shown) to make electrical contact with the gates 30 and the source/drain junctions 32, respectively. In the comparative device layout of FIG. 1, however, the gate contacts 80 are spaced away from active regions of the device in order to avoid unwanted interference between the source/drain contacts 70 and the gate contacts 80. Such a layout inefficiently uses the available space.

Referring to FIG. 2, according to various embodiments, gate contacts 80 are located within active regions of the device, and adjacent to the source/drain contacts 70. In certain embodiments, the gate contacts are located proximate to the fins 12, i.e., overlying a fin 12. Locating the gate contacts 80 proximate to the source/drain contacts 70 decreases the footprint of the device relative to the comparative layout of FIG. 1. In the illustrated example, an areal dimension of the device layout can be decreased by an amount Δh while exhibiting the same functionality as the comparative layout. As described herein, methods for forming such a structure provide effective isolation between adjacent conductive features, which significantly decreases the parasitic capacitance or leakage therebetween.

In accordance with various embodiments, a method of forming a FinFET device includes forming source/drain junctions over source/drain regions of a semiconductor fin, forming a first dielectric layer directly over the source/drain junctions, and forming a second dielectric layer laterally displaced from the first dielectric layer and extending orthogonal to a length direction of the fin. The first and second dielectric layers may be formed from materials that can be etched selectively to one another. A gate is then formed over a channel region of the semiconductor fin between the source/drain regions and adjacent to the previously-formed first and second dielectric layers. The gate comprises a gate dielectric disposed over the channel region and a gate conductor disposed over the gate dielectric.

According to further embodiments, a FinFET device includes a semiconductor fin having source/drain junctions disposed over source/drain regions of the semiconductor fin, and a channel region within the semiconductor fin between the source/drain junctions. A gate, including a gate dielectric disposed over the channel region and a gate conductor disposed over the gate dielectric is in electrical contact with the channel region.

The FinFET device also includes a source/drain contact in electrical contact with one of the source/drain junctions, and a gate contact in electrical contact with the gate conductor, wherein at least a portion of each of the source/drain contact and the gate contact is disposed over the semiconductor fin.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 3B is a cross-sectional view of the structure of FIG. 3A taken along line B-B parallel to, but laterally spaced from semiconductor fins, showing the dielectric refill of source/drain contact openings and a conductive fill layer forming various gates;

FIG. 4A shows the formation of a hard mask layer over the structure of FIG. 3A;

FIG. 4B is a cross-sectional view taken along the line B-B of the structure of FIG. 4A showing the hard mask;

FIG. 5A is a perspective view showing a block mask according to various embodiments disposed over the structure of FIG. 4A;

FIG. 5B is a cross-sectional view of the block mask disposed over a portion of a gate;

FIG. 6A shows patterning of the hard mask layer over a portions of the gate following removal of the block mask;

FIG. 6B shows the patterned hard mask layer disposed over a gate;

FIG. 7A is a post-etch perspective view following a recess etch of the gates within unmasked regions;

FIG. 7B is a post-etch cross-sectional view showing partial removal of the unmasked gates to form gate recesses;

FIG. 8A depicts a post-planarization architecture after back-filling the gate recesses with an etch-selective dielectric cap;

FIG. 8B is a cross-sectional view taken along the line B-B of the structure of FIG. 8A showing capping of the previously-recessed gate metal;

DETAILED DESCRIPTION

Figure 1:
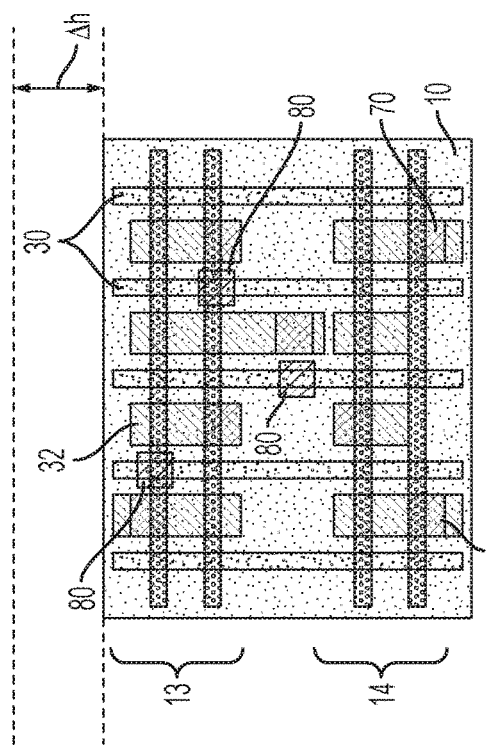
FIG. 1 is a comparative device layout showing gate contacts disposed over shallow trench isolation regions.
Figure 2:
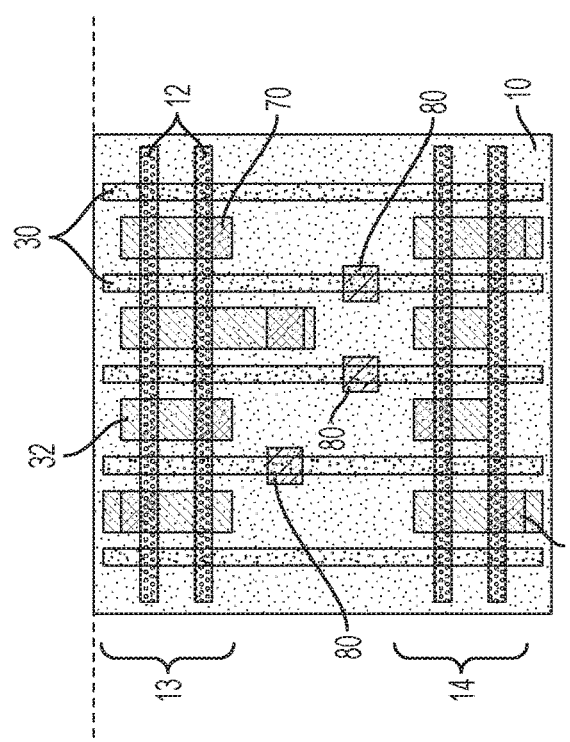
FIG. 2 is a device layout according to various embodiments showing gate contacts disposed within active device regions and proximate to source/drain contacts.

Reference will now be made in greater detail to various embodiments of the subject matter of the present application, some embodiments of which are illustrated in the accompanying drawings. The same reference numerals will be used throughout the drawings to refer to the same or similar parts.

Disclosed in various embodiments is a method of manufacturing a FinFET device having a reduced footprint. In particular, the method involves decreasing the space between conductive features without incurring a substantial performance penalty related to increased parasitic capacitance or leakage, for example.

In certain embodiments, initial steps of a source/drain contact module, which include patterning and etching openings to expose source/drain junctions, are performed prior to a replacement metal gate (RMG) module. In particular, because the etching step to expose the source/drain junctions is performed prior to replacement of a sacrificial gate with a functional gate, the use of a gate cap can be avoided. A gate cap is typically used to protect the functional gate during the etch step that forms the source/drain contact openings. A "functional gate" refers to a structure used to control output current (i.e., the flow of carriers through a channel) of a semiconductor device using an electrical field or, in some instances, a magnetic field, and include a gate dielectric and a gate conductor.

According to further embodiments, gate contacts and source/drain contacts may be independently formed by patterning a respective hard mask as a blocking mask where such contacts are desired, and recessing the gate metal or the source/drain metal within unblocked areas. Different metals having different etch selectivity may be used for the source/drain and the gate contact metallizations. Methods for forming a FinFET device using etch selective metallization are described herein with reference to FIGS. 3-16.

Figure 3A:
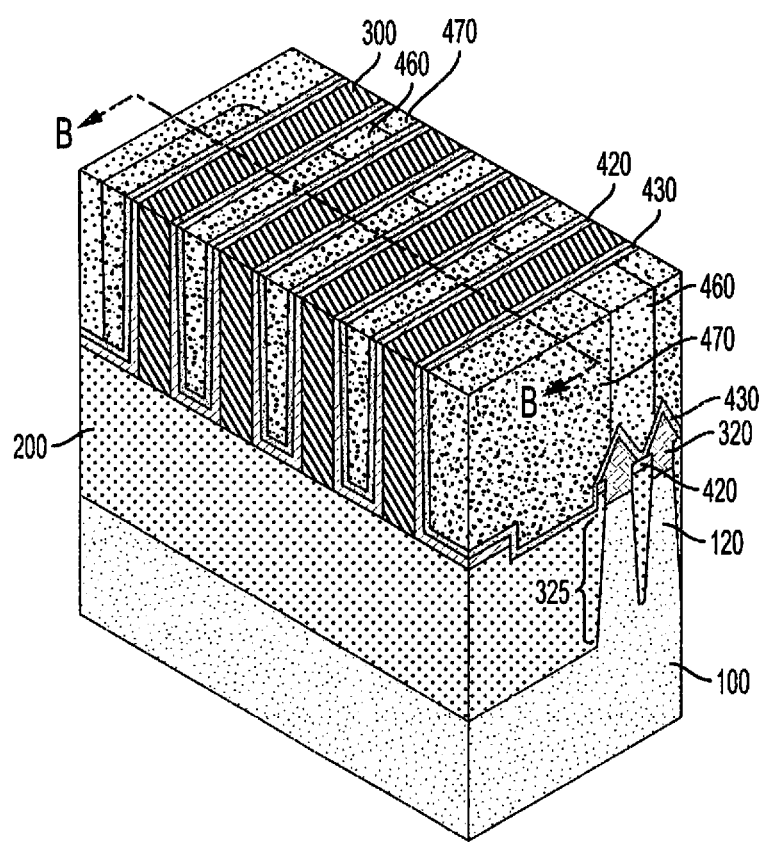
FIG. 3A is a schematic perspective diagram of a planarized fin field effect transistor (FinFET) device at an intermediate stage of fabrication following a replacement metal gate module.

Referring to FIG. 3A, shown is a schematic perspective diagram of a planarized fin field effect transistor (FinFET) at an intermediate stage of fabrication following a replacement metal gate module. In the illustrated structure, plural semiconductor fins 120 are arrayed over a semiconductor substrate 100. An insulating material such as flowable silicon dioxide is deposited to cover the fins 120 and optionally etched back to form a shallow trench isolation (STI) layer 200.

The semiconductor substrate 100 may be a bulk substrate or a composite substrate such as a semiconductor-on-insulator (SOI) substrate. For instance, semiconductor substrate 100 may comprise a semiconductor material such as silicon (Si) or a silicon-containing material. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. The semiconductor substrate 100 is not limited to silicon-containing materials, however, as the substrate 100 may comprise other semiconductor materials, including Ge and compound semiconductors such as GaAs, InAs and other like semiconductors. Portions of the semiconductor substrate 100 may be amorphous, polycrystalline, or single crystalline.

In various embodiments, fins 120 comprise a semiconductor material such as silicon, and may be formed by patterning and then etching the semiconductor layer of an SOI substrate or a top portion of a bulk semiconductor substrate. The etching process typically comprises an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

In further embodiments, the fins 120 may be formed using a sidewall image transfer (SIT) process, which includes formation of a spacer material on sidewall surfaces of a mandrel. The spacer includes a material that has a different etch selectivity than the mandrel such that, after spacer formation, the mandrel is removed by etching. Each spacer is then used as a hard mask during a subsequent etching process that defines the fins.

As used herein, a "fin" refers to a contiguous semiconductor material that includes a pair of substantially vertical sidewalls that are substantially parallel to each other. The fins 120 are formed from any suitable semiconductor material and may comprise, for example, single crystal Si, single crystal germanium, single crystal silicon germanium (SiGe), and the like. The term "single crystalline" denotes a crystalline solid in which the crystal lattice of the entire solid is substantially continuous and substantially unbroken to the edges of the solid with substantially no grain boundaries.

Each fin has a height (H) that may range from 10 nm to 100 nm and a width (W) that may range from 4 nm to 30 nm, although other heights and widths that are less than or greater than the foregoing values can also be used. Plural fins may have identical or substantially identical dimensions, i.e., height and/or width. As used herein, substantially identical dimensions vary by less than 10%, e.g., less than 5%, 2% or 1%. The fins 120 may have an aspect ratio (UM) ranging from 1 to 5, e.g., 1, 1.5, 2, 3, 4 or 5, including ranges between any of the foregoing values.

The semiconductor fins 120 may be doped, un-doped, or contain doped and un-doped regions therein. Each doped region within the semiconductor fins 120 may have the same or different doping concentrations and/or conductivities. Doped regions that are present can be formed, for example, by ion implantation, gas phase doping, diffusion from epitaxy, or by dopants that are present in the material used to form the fins. For instance, fins 120 may be formed from the semiconductor layer of an SOI substrate, which may comprise a dopant prior to forming the fins. By way of example, fins 120 may be uniformly doped and have a dopant concentration in the range of $1 \times 10^{15}$ atoms/cm$^3$ to $1 \times 10^{18}$ atoms/cm$^3$.

In various embodiments, each of a plurality of semiconductor fins 120 extends along a lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

In structures comprising plural fins, i.e., a fin array, each fin may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. Such plural fins are typically oriented parallel to each other and perpendicular to the library logic flow of a circuit. After fin formation, a fin cut or fin removal process may be used to eliminate unwanted fins or portions thereof for the particular circuit or device being fabricated. Thus, the fin-to-fin periodicity may be constant or variable over an array of fins.

A process of forming the structure of FIG. 3A may comprise a gate last, or replacement metal gate (RMG) process. A typical process flow for manufacturing replacement metal gate (RMG) transistors includes forming a temporary or sacrificial gate, forming additional transistor features, and then removing the sacrificial gate leaving a trench where various layers of material are deposited to form the functional gate. This approach delays gate formation until after processing that may otherwise damage the gate materials, such as exposure to elevated temperatures and/or ion implantation.

In the instant embodiment, a replacement metal gate (RMG) module is used to form a gate 300 over the top and sidewall surfaces of a channel region of each fin 120. The gate 300 includes a conformal gate dielectric formed directly over the exposed top and sidewall surfaces of the fins, and a gate conductor formed over the gate dielectric. For clarity, the gate dielectric and gate conductor layers are not separately shown.

The gate dielectric may include silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing.

The gate conductor may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may comprise one or more layers of such materials such as, for example, a metal stack including a work function metal layer and/or a conductive liner and a fill metal. In certain embodiments, the gate conductor comprises a titanium nitride (TiN) layer directly over the gate dielectric and a tungsten or cobalt fill layer over the titanium nitride layer.

Referring still to FIG. 3A, shown is a perspective, post-planarization view of a FinFET device at an intermediate stage of fabrication. Prior to the RMG module used to form the functional gate 300 over channel regions of the fins, openings may be formed in the interlayer dielectric 460 to expose source and drain regions of the fins, and raised junctions 320 are formed over the source/drain regions 325. That is, raised source/drain junctions 320 are formed over source and drain regions 325 of the fins 120 on either side of the channel regions, which underlie the gate 300.

Source/drain junctions 320 may be formed by ion implantation or selective epitaxy prior to formation of the functional gates 300, optionally using the sacrificial gates as an alignment mask. For instance, according to various embodiments, source/drain junctions 320 are formed by selective epitaxy into self-aligned cavities that are defined over the fins between the sacrificial gates.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition.

Source/drain junctions 320 may comprise silicon (e.g., Si) or a silicon-containing material such as silicon germanium (SiGe). For instance, SiGe source/drain junctions may be incorporated into a p-MOS device to provide compressive stress to the channel, which can improve carrier mobility.

The source/drain junctions 320 and corresponding (i.e., underlying) source/drain regions 325 of the fin 120 may be doped, which may be performed in situ, i.e., during epitaxial growth, or following epitaxial growth, for example, using ion implantation. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

For instance, if a plurality of semiconductor fins 120 are doped with dopants of a first conductivity type, the plurality of source/drain junctions 320 can be doped with dopants of a second conductivity type, which is the opposite of the first conductivity type. If the first conductivity type is p-type, the second conductivity type is n-type, and vice versa. By way of example, a dopant region is implanted with arsenic or phosphorus to form an n-type region. In another example, a dopant region is implanted with boron to form a p-type region. The dopant concentration within the source/drain junctions 320 may range from $1 \times 10^{19}$ atoms/cm$^3$ to $1 \times 10^{22}$ atoms/cm$^3$.

An optional drive-in anneal can be used to diffuse dopant species and generate a desired dopant profile. In certain embodiments, dopant atoms within the source/drain junctions 320 may be diffused into the semiconductor fins 120 using a post-epitaxy or post-implantation anneal (e.g., at a temperature of 600° C. to 1400° C.) to create a desired dopant profile within the fins proximate to the source/drain junctions 320.

In the illustrated embodiment, sidewalls spacers 420 are disposed over sidewalls (vertical surfaces) of the gates 300, and a conformal liner 430 is disposed over the sidewall spacers 420 as well as over a top surface of the source/drain junctions 320. The conformal liner 430 is adapted to function as a contact etch stop layer (CESL).

Sidewall spacers 420 may be formed by blanket deposition of a spacer material (e.g., using atomic layer deposition) followed by a directional etch such as reactive ion etching (RIE) to remove the spacer material from horizontal surfaces. In certain embodiments, the sidewall spacer 420 thickness is 4 to 20 nm, e.g., 4, 10, 15 or 20 nm, including ranges between any of the foregoing values.

Conformal liner 430 may be formed by blanket deposition of a suitable contact etch stop material (e.g., using atomic layer deposition). As seen with reference to FIG. 3A, within the source/drain contact locations, the conformal liner 430 is formed over the sidewall spacers 420 as well as over the source/drain junctions 320. In certain embodiments, the conformal liner 430 thickness is 2 to 10 nm, e.g., 2, 4, 6, 8 or 10 nm, including ranges between any of the foregoing values.

Suitable sidewall spacer and conformal liner materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. As used herein, a low-k material has a dielectric constant less than that of silicon dioxide.

As described herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

In various embodiments, the sidewall spacers 420 and the conformal liner 430 are formed from materials that can be etched selectively to one another. In particular embodiments, the sidewall spacers 420 comprises SiOCN and the conformal liner (i.e., contact etch stop layer) 430 comprises silicon nitride.

As seen with reference to FIGS. 3A and 3B, dielectric layers 460, 470 are disposed between adjacent gates 300, i.e., directly over the conformal liner 430. The dielectric layers 460, 470 may comprise any dielectric materials including, for example, oxides, nitrides, oxycarbides or oxynitrides. In various embodiments, dielectric layers 460, 470 include an interlayer dielectric 460 and a refill dielectric 470. The interlayer dielectric 460 (e.g., SiO$_2$) fills the contacted regions directly overlying the source/drain junctions, while the refill dielectric 470 fills the non-contacted regions overlying STI 200.

In various embodiments, dielectric layers 460, 470 can be etched selectively with respect to one another, which during subsequent processing will enable the formation of source/drain contacts. For instance, etch selective dielectric layers enable the subsequent removal of the interlayer dielectric 460 from over source/drain contact locations without a further masking step, i.e., using an etching process that is selective to the refill dielectric 470. An example refill layer 470 comprises a carbon-doped oxide, such as silicon oxycarbide (SiOC), which is deposited in locations where source/drain contacts are not to be formed. In the illustrated embodiment, the top surface of the dielectric layers 460, 470 can be planarized by chemical mechanical polishing (CMP).

"Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Thus, in the illustrated embodiment, the gates 300 alternately pass between the interlayer dielectric 460 disposed over source/drain junctions 320 and refill dielectric 470 disposed over the shallow trench isolation layer 200 between adjacent fins.

FIG. 3B is a cross-sectional view of the structure of FIG. 3A taken along the line B-B parallel to, but between adjacent semiconductor fins. As will be appreciated, the FIG. 3B view is out of plane from the source/drain junctions 320 and associated source/drain contact locations, and illustrates a non-contacted region. Within the non-contacted region, gate 300 is disposed over shallow trench isolation layer 200, i.e., the gate 300 is disposed directly over shallow trench isolation layer 200, and the conformal liner 430 separates the refill dielectric 470 from the shallow trench isolation layer 200. It will be appreciated that each of the views in FIGS. 3B-8B are taken along a non-contacted cross-section.

Referring now to FIGS. 4-15, a series of patterning and selective etch steps are used to discriminate between source/drain contact regions and non-contacted regions and analogous gate contact and non-contacted regions within the device architecture to form source/drain contacts and gate contacts.

Specifically, patterning and etching processes are used to define gate contact locations, and form a capping layer over the gate structures within non-gate contact locations. Openings to the source/drain junctions are created and metallized, and additional patterning and etching processes are used to define source/drain contact locations and form a capping layer over recessed source/drain contact metallization within non-source/drain contact locations.

In accordance with exemplary embodiments, a gate contact module is described with reference to FIGS. 4-7, a gate cap module is illustrated in FIG. 8, a trench silicide module is shown in FIGS. 9 and 10, a source/drain contact module is described with reference to FIGS. 11-14, and a trench silicide cap module is illustrated in FIG. 15.

Referring to FIGS. 4A and 4B, a hard mask 500 is formed over the planarized architecture shown in FIGS. 3A and 3B. Hard mask 500 may comprise silicon nitride, for example. Then, referring to FIG. 5A, a block mask 600 is formed over the device structure, i.e., directly over hard mask 500. In accordance with various embodiments, block mask 600 includes, from bottom to top, a spin on hard mask 601, a nitride layer 602, an anti-reflective coating 603, and a photoresist layer 604. Block mask 600 may be used to pattern the hard mask 500 over gate contact locations.

According to illustrative embodiments, using a photolithography process, the photoresist layer 604 is subjected to a pattern of irradiation, and the exposed photoresist material is developed utilizing a conventional resist developer. As shown in FIGS. 5A and 5B, this provides a patterned layer of photoresist atop the remaining layers of the block mask 600. The pattern provided by the patterned photoresist material is thereafter transferred into the underlying material layers (e.g., remaining portions of the block mask 600 as well as hard mask 500).

The pattern transfer etching process is typically an anisotropic etch. In embodiments, a dry etching process such as, for example, reactive ion etching can be used. In other embodiments, a combination of dry etching and wet etching can be used.

Referring to FIG. 6A, the pattern transfer etching process removes unmasked portions of the hard mask 500 exposing top surfaces of the gates 300, as well as sidewall spacers 420, interlayer dielectric 460, and refill dielectric 470. In embodiments, the etch chemistry used to etch the nitride hard mask 500 is selective to tungsten, silicon dioxide and carbon-doped silicon dioxide, which enables the hard mask 500 to be etched selectively with respect to the gates 300, sidewall spacers 420, conformal liner 430, and refill dielectric 470. Referring to FIG. 6B, which shows the patterned structure following removal of the block mask 600, remaining portions of the hard mask 500 overlie gate contact locations.

Referring to FIGS. 7A and 7B, exposed portions of the gates 300 are recessed using one or more selective etch steps to form openings 304. That is, portions of the gate conductor (e.g., W) unprotected by hard mask 500 are recessed. For instance, one or more anisotropic etch steps, e.g., reactive ion etch steps, can be used to recess the gate metal. FIG. 7A is a post-etch perspective view following a recess etch of the gates within unmasked regions. FIG. 7B is a post-etch cross-sectional view showing partial removal of the unmasked gates to form openings 304. In certain embodiments, 25% to 75% of the original gate height is removed by the recess etch.

Referring to FIGS. 8A and 8B, openings 304 are back-filled with a capping layer 306. Capping layer 306 may comprise a nitride material such as silicon nitride or silicon oxynitride (SiON). Following deposition of the capping layer 306, a further planarization process may be used to remove the overburden and form a planarized structure. During the planarization process, the interlayer dielectric 460 (e.g., $SiO_2$) and/or refill dielectric 470 (e.g., SiOC) may function as an etch stop layer.

In the planarized structure, a top surface of the capping layer 306 and respective top surfaces of the sidewall spacers 420, contact etch stop layer 430, and refill dielectric 470 are mutually co-planar over the shallow trench isolation layer 200 between adjacent fins, and a top surface of the capping layer 306 and respective top surfaces of the sidewall spacers 420, contact etch stop layer 430, and interlayer dielectric 460 are mutually co-planar over source/drain contact locations. The planarization process exposes top surfaces of the gate 300 at gate contact locations, i.e., portions of the gate 300 previously protected by patterned hard mask 500. Exposure of the gate metal within gate contact locations is enabled by the absence of a gate cap formed over the gate prior to the gate recess etch. FIGS. 8A and 8B depict a post-planarization architecture after back-filling the openings 304 with capping layer 306.

Figure 9A:
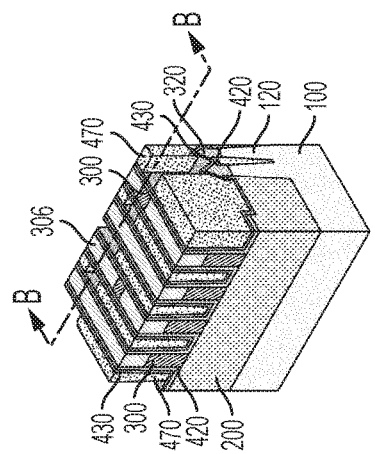
FIG. 9A is a perspective view showing the selective removal of a dielectric layer and the attendant formation of cavities over source/drain junctions.

Referring to FIG. 9A, an etch step is used to selectively remove interlayer dielectric 460 from over source/drain contact locations, i.e., from over source/drain junctions 320. Interlayer dielectric 460 may be removed selectively with respect to refill dielectric 470. By way of example, removal of the interlayer dielectric 460 from over source/drain junctions 320 can be performed using an etch that is selective to the dielectric refill layer 470 and the gate 300, preserving the conformal liner 430 and the sidewall spacers 420. For instance, in various embodiments, a wet etch (i.e., isotropic etch) comprising hydrofluoric acid (HF) can be used. Hydrofluoric acid or a solution comprising dilute hydrofluoric acid (d-HF) can be used to etch the interlayer dielectric 460 selectively with respect to a carbon-doped oxide (e.g., SiOC).

Figure 9B:
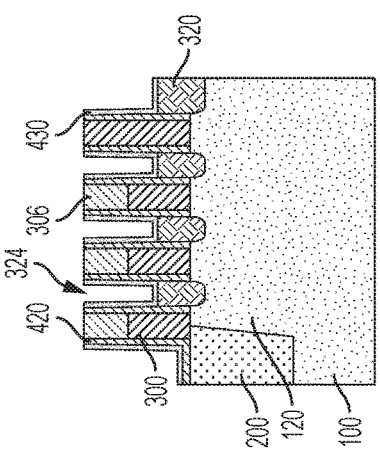
FIG. 9B depicts the selective removal of the dielectric layer to form cavities over source/drain junctions of the FinFET architecture.

FIGS. 9A and 9B are perspective view and cross-sectional views, respectively, showing the selective removal of the interlayer dielectric 460 and the attendant formation of cavities 324 over source/drain junctions. It will be appreciated that the view in FIG. 9B, as well as in FIGS. 10B-15B, are taken along a contacted cross-section of the device architecture. That is, the cross-sections are taken through a fin 120, rather than through STI 200.

Figure 10A:
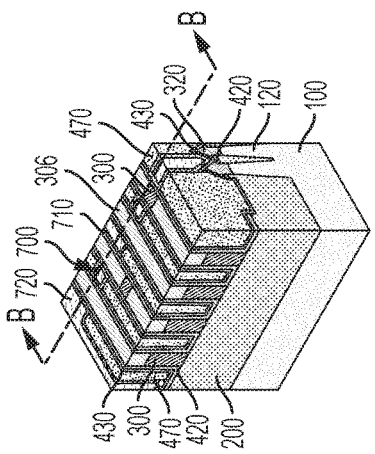
FIG. 10A is a perspective view of the FinFET architecture following a contact metallization module to fill the cavities of FIG. 9A.
Figure 10B:
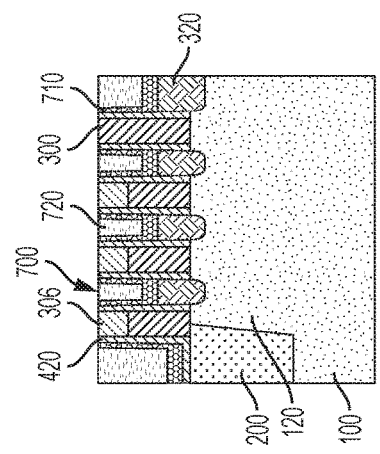
FIG. 10B shows the formation and planarization of source/drain contacts within the cavities of FIG. 9B and over source/drain junctions.

Conformal liner 430, which may function as an etch stop layer during removal of the interlayer dielectric 460 from source/drain contact locations, may then be removed and the resulting cavities 324 metallized as shown in FIGS. 10A and 10B. For instance, the conformal liner 430 can be removed from over the source/drain junctions 320 to form self-aligned contact openings for forming source/drain contacts. The conformal liner 430 can be removed by a reactive ion etch, isotropic plasma etch, or wet etch. For example, a wet etch comprising phosphoric acid can be used to strip the conformal liner.

In various embodiments, the conformal liner 430 protects the underlying STI 200 during etching of the interlayer dielectric 460. Furthermore, it will be appreciated that insomuch as conformal liner 430 and capping layer 306 may each comprise a nitride material (e.g., silicon nitride), removal of the conformal liner 430 may decrease the thickness of capping layer 306. However, the thickness of the conformal liner 430 is typically substantially less than the thickness of the capping layer 306 such that removal of the conformal liner 430 does not result in complete removal of the capping layer 306.

Referring to FIG. 10B, a conductive contact 700 is formed within the cavities 324 and over exposed surfaces of the source/drain junctions 320 by depositing, for example, a conductive liner 710, typically titanium (Ti), and then filling the cavities 324 with a barrier such as titanium nitride and a contact layer (collectively 720) such as tungsten or cobalt, for example. Conductive contacts 700 may include a metal that forms an ohmic contact with the source/drain junctions 320. During subsequent processing, a silicide layer (e.g., titanium silicide) may be formed in situ via reaction between the conductive liner 710 and the source/drain junctions 320 to form a trench silicide contact. Following deposition of the conductive contacts 700, the structure can be polished to remove the overburden (i.e., excess metal) in a manner known to those skilled in the art.

FIGS. 10A and 10B show the device architecture after deposition and planarization of liner 710 and barrier/contact fill layer 720 over and in electrical contact with source/drain junctions 320. In the planarized structure, a top surface of the conductive contacts 700 is co-planar with a top surface of the un-recessed gates 300 and co-planar with capping layers 306 formed over recessed gates.

In the illustrated structure, a top surface of the gate 300 and respective top surfaces of the conductive contacts 700 and sidewall spacers 420 are mutually co-planar over source/drain contact locations (FIG. 10B), and a top surface of the gate 300 and respective top surfaces of the dielectric refill layer 470, contact etch stop layer 430, and sidewall spacers 420 are mutually co-planar over the shallow trench isolation layer between adjacent fins.

Figure 11A:
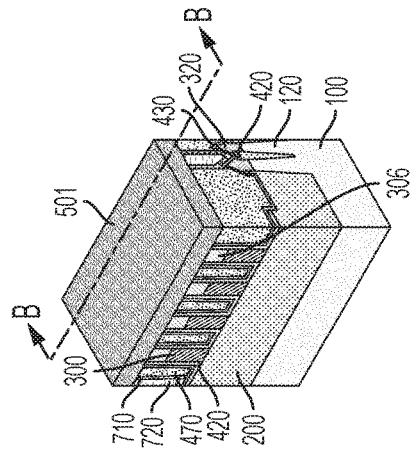
FIG. 11A shows the formation of a hard mask layer over the structure of FIG. 10A.
Figure 11B:
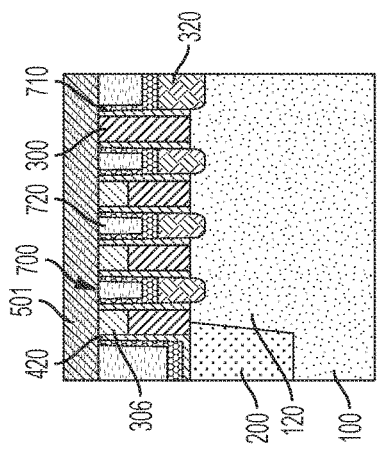
FIG. 11B is a cross-sectional view taken along the line B-B of FIG. 11A showing the hard mask layer.
Figure 12A:
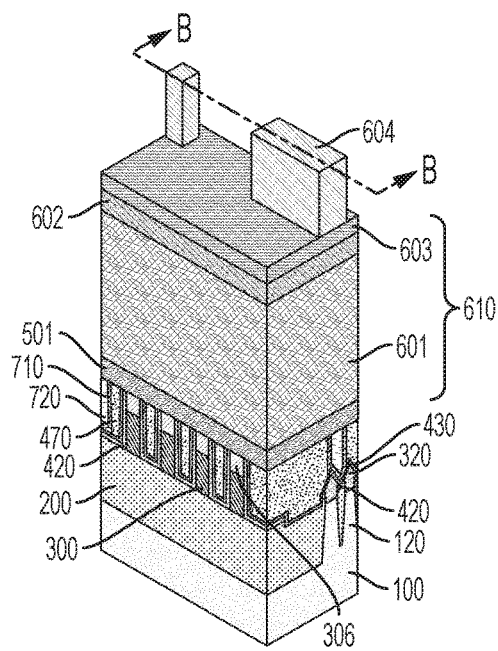
FIG. 12A is a perspective view showing a further block mask disposed over the structure of FIG. 11A.
Figure 12B:
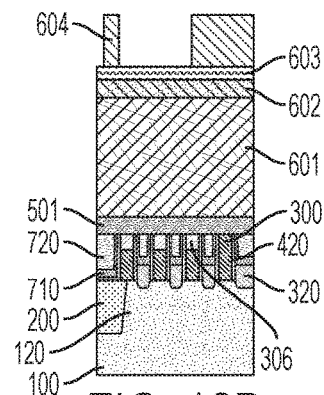
FIG. 12B is a cross-sectional view of the block mask of FIG. 12A formed over source/drain contacts.

Following a pattern transfer etch of the hard mask 500 and metallization of the cavities 324 to form conductive contacts 700, referring to FIGS. 11A and 11B, a hard mask 501 is formed over the planarized architecture shown in FIGS. 10A and 10B. Hard mask 501 may comprise silicon nitride, for example. Then, referring to FIGS. 12 and 12B, a further block mask 610 is formed over the device structure, i.e., directly over hard mask 501. In accordance with various embodiments, further block mask 610 may include the same structure and materials used to form block mask 600. Further block mask 610 may be used to pattern the hard mask 500 over source/drain contact locations.

Figure 13A:
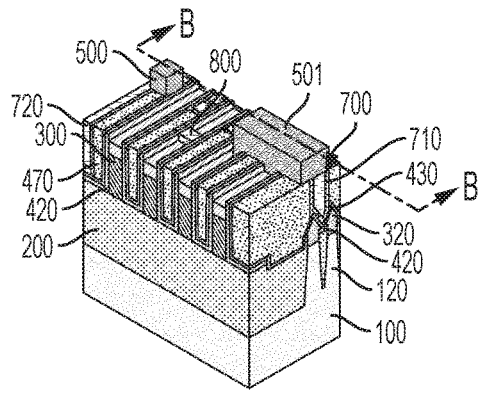
FIG. 13A shows patterning of the hard mask layer over the source/drain contacts and exposure of the un-recessed gate following removal of the further block mask.
Figure 13B:
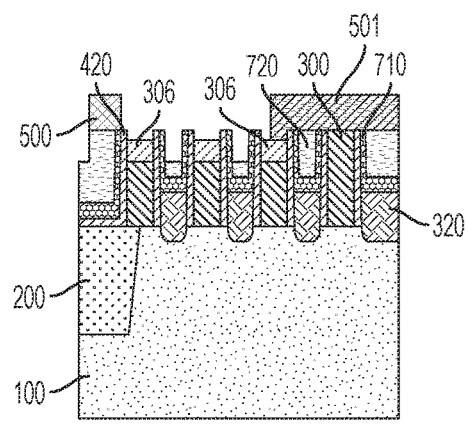
FIG. 13B shows the patterned hard mask layer disposed over source/drain contacts and gate contacts.

Following removal of the further block mask 610, FIGS. 13A and 13B show patterned hard mask 501 disposed over selected conductive contacts 700, which define source/drain contacts. The patterned etch also exposes the uncapped, top portion of gate 300, which defines a gate contact 800. As will be appreciated, the etching step(s) used to pattern the hard mask 501 and remove the further block mask 610 may also recess capping layer 306 over the recessed gates 300 and recess sidewall spacers 420.

Figure 14A:
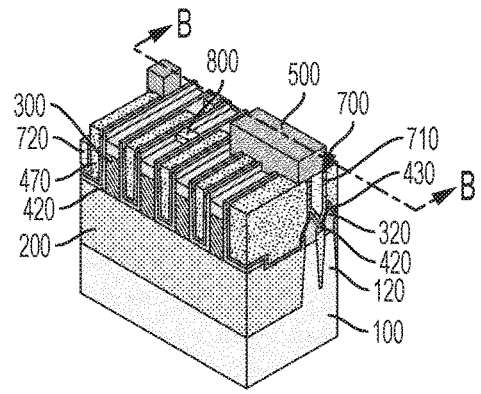
FIG. 14A depicts recessing of exposed source/drain contacts from within unmasked regions.
Figure 14B:
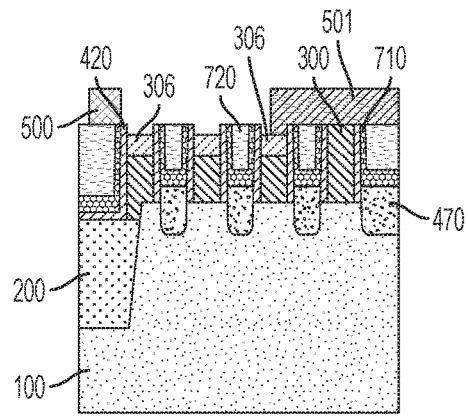
FIG. 14B shows the selective etching of unmasked source/drain contacts to form cavities.

Referring to FIGS. 14A and 14B, in areas unprotected by hard mask 501, a selective etch is used to recess conductive contacts 700. For instance, exposed portions of the conductive contacts 700 can be recessed using a reactive ion etch. Alternatively, exposed portions of the conductive contacts 700 can be recessed using a wet etch. In various embodiments, the selective etch used to recess the conductive contacts (e.g., cobalt fill layer 720 and titanium nitride liner 710) is adapted to etch cobalt, titanium and titanium nitride selectively with respect to the material(s) forming the gate conductor and gate contacts (e.g., tungsten). In exemplary embodiments, the conductive contacts 700 can be recessed to have the same height as previously-recessed gates 300.

Figure 15A:
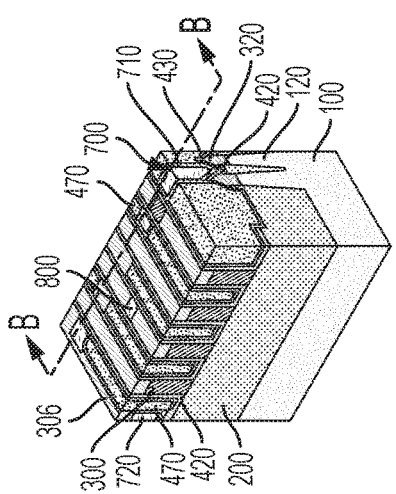
FIG. 15A depicts a post-planarization architecture after back-filling the cavities over source/drain contacts.
Figure 15B:
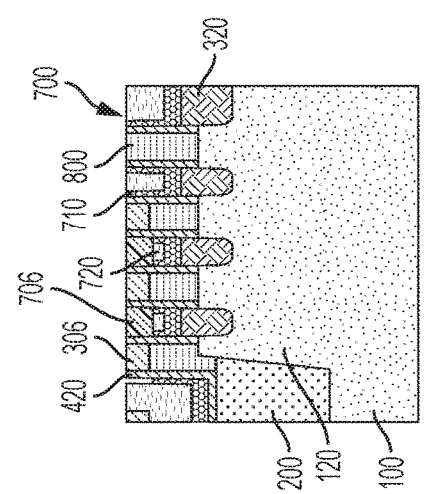
FIG. 15B is a post-planarization architecture after back-filling cavities over source/drain contacts with a dielectric cap.

Referring to FIGS. 15A and 15B, the recessed conductive contacts 700 are backfilled with a capping layer 706. Capping layer 706 may comprise a nitride material such as silicon nitride or silicon oxynitride (SiON). A planarization process may then be used to remove the overburden and expose source/drain contacts 700 and gate contacts 800.

Figure 16:
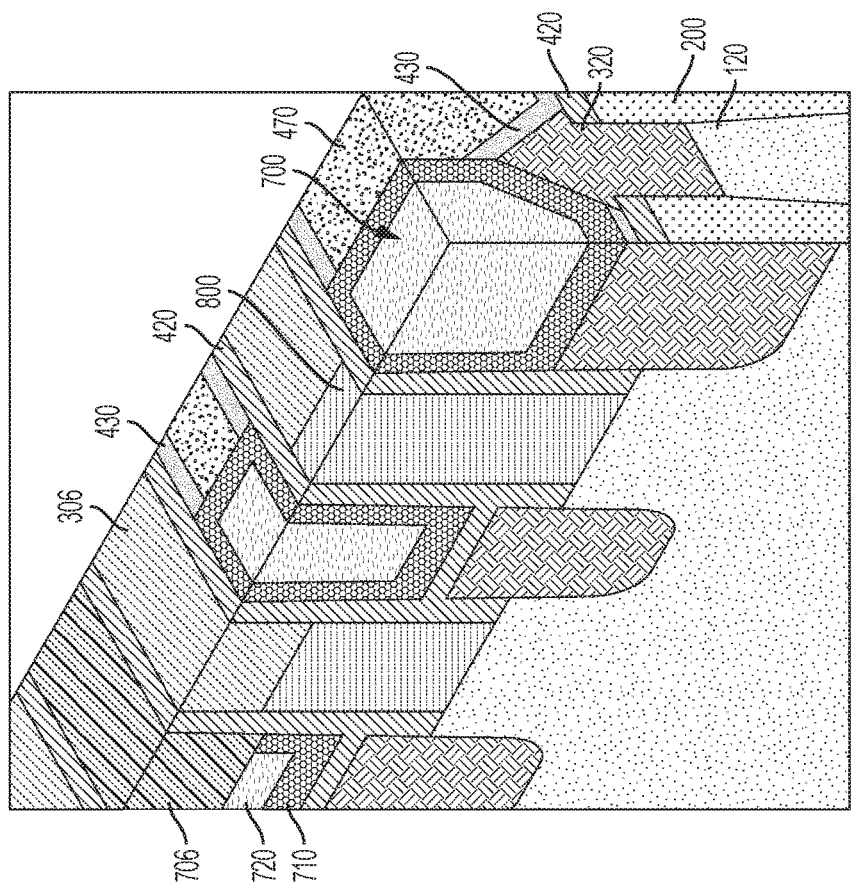
FIG. 16 is a magnified perspective view showing adjacent source/drain and gate contacts.

Referring to FIG. 16, illustrated is a magnified perspective view showing adjacent source/drain contacts 700 and gate contacts 800. In exemplary embodiments, a source/drain contact 700 and a gate contact 800 for a FinFET device may be located adjacent to one another, where both contacts 700, 800 are disposed within the active area of the device. In FIG. 16, for example, a source/drain contact 700 and a gate contact 800 are each positioned over fin 120, and are separated laterally by sidewall spacer 420.

Figure 17:
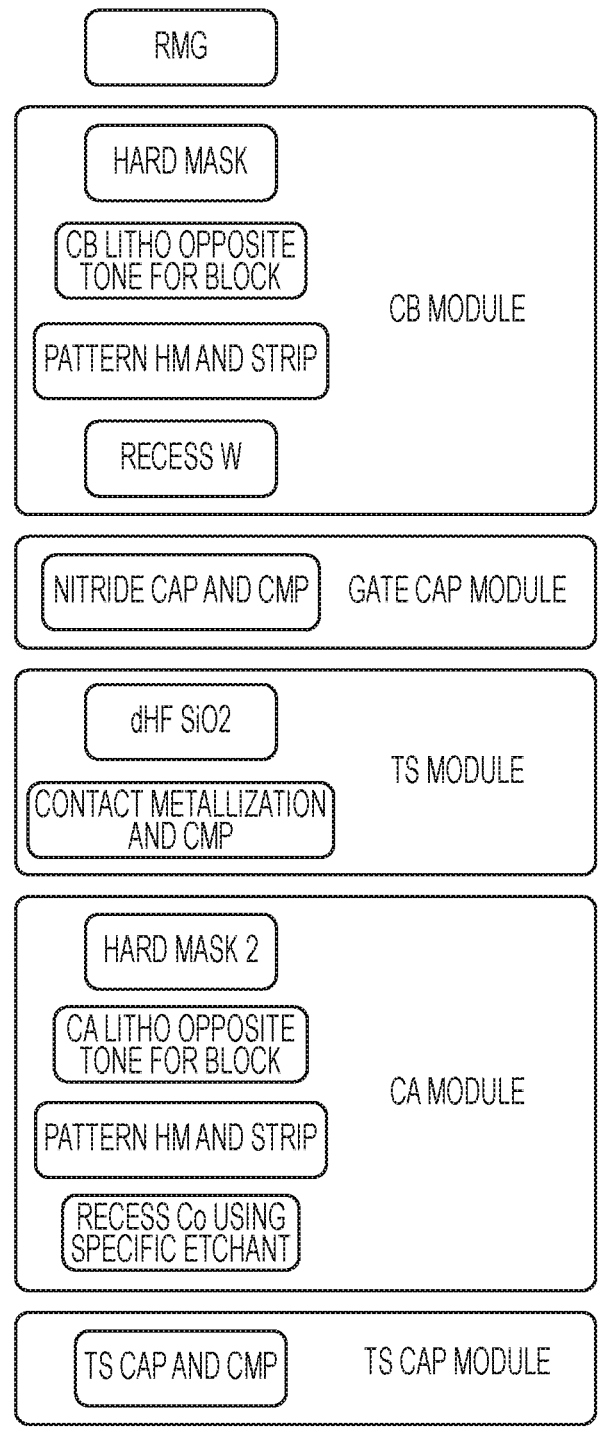
FIG. 17 is a flow chart detailing an example process for forming a FinFET device.

An example process for forming a FinFET device is outlined in the flowchart shown in FIG. 17. According to several embodiments, and as described above, patterning to form trench silicide openings precedes a replacement metal gate (RMG) process. Gate and source/drain contacts are created by patterning and maintaining a respective hard mask as a block mask where contacts are to be formed. In contrast to conventional methods for forming source/drain and gate contacts, which typically include forming an interlayer dielectric over the structure to be contacted, forming openings in the interlayer dielectric, and metallizing the openings, the contact structures according to various embodiments are defined in a self-aligned, subtractive process where the metal layers are recessed outside of respective contact locations. The recessed regions are backfilled with a dielectric cap.

The disclosed method provides a robust metallization architecture with a decreased likelihood of inter-contact electrical short circuits. Integrated circuits fabricated with the instant method may have improved reliability and performance, with minimal leakage between gate and source/drain contacts, and decreased instances of circuit failure.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a spacer that comprises silicon nitride include embodiments where a spacer consists essentially of silicon nitride and embodiments where a spacer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a FinFET device, comprising:
   forming source/drain junctions over source/drain regions of a semiconductor fin;
   forming a first dielectric layer directly over the source/drain junctions;
   forming a second dielectric layer laterally adjacent to the first dielectric layer and extending orthogonal to a length direction of the fin; and
   forming a gate over a channel region of the semiconductor fin between the source/drain regions and adjacent to the previously-formed first and second dielectric layers, wherein the gate comprises a gate dielectric disposed over the channel region and a gate conductor disposed over the gate dielectric.

2. The method of claim 1, wherein the first dielectric layer comprises silicon dioxide ($SiO_2$) and the second dielectric layer comprises silicon oxycarbide (SiOC).

3. The method of claim 1, further comprising forming a sacrificial gate over the channel region of the semiconductor fin prior to forming the source/drain junctions.

4. The method of claim 3, further comprising forming sidewall spacers over sidewalls of the sacrificial gate and a conformal liner over the sidewall spacers and over the source/drain junctions.

5. The method of claim 4, wherein the sidewall spacers comprise SiOCN and the conformal liner comprises silicon nitride.

6. The method of claim 4, wherein the sidewall spacer has a thickness of 4 to 20 nm and comprises silicon nitride.

7. The method of claim 4, wherein forming the gate comprises removing the sacrificial gate selective to the sidewall spacers and the conformal liner.

8. The method of claim 1, further comprising:
   forming a first hard mask over a first portion of the gate;
   recessing a second portion of the gate unblocked by the first hard mask;
   forming a capping layer over the recessed second portion of the gate;
   etching the first dielectric layer and the conformal liner to expose the source/drain junctions;
   forming a contact layer over the source/drain junctions;
   forming a second hard mask over a first portion of the contact layer;
   recessing a second portion of the contact layer unblocked by the second hard mask; and
   forming a capping layer over the recessed second portion of the contact layer.

9. The method of claim 8, wherein the first portions of the gate and the first portions of the contact layer are each at least partially disposed over the semiconductor fin.

10. The method of claim 8, wherein the second portion of the contact layer is recessed using a wet etch selective to the gate.

11. The method of claim 8, wherein the contact layer comprises cobalt and the gate comprises tungsten.

* * * * *